(12) United States Patent
Cordaro et al.

(10) Patent No.: US 8,212,684 B2
(45) Date of Patent: Jul. 3, 2012

(54) INDUSTRIAL UNIVERSAL ELECTROMETER

(75) Inventors: Joseph V. Cordaro, Martinez, GA (US);
Michael B. Wood, Aiken, SC (US)

(73) Assignee: Savannah River Nuclear Solutions, LLC, Aiken, SC (US)

( * ) Notice: Subject to any disclaimer, the term of this patent is extended or adjusted under 35 U.S.C. 154(b) by 521 days.

(21) Appl. No.: 12/311,718

(22) PCT Filed: Oct. 10, 2007

(86) PCT No.: PCT/US2007/021765
§ 371 (c)(1),
(2), (4) Date: Apr. 9, 2009

(87) PCT Pub. No.: WO2008/079177
PCT Pub. Date: Jul. 3, 2008

(65) Prior Publication Data
US 2010/0019915 A1    Jan. 28, 2010

Related U.S. Application Data

(60) Provisional application No. 60/851,150, filed on Oct. 12, 2006.

(51) Int. Cl.
*G08B 21/00* (2006.01)

(52) U.S. Cl. ........ 340/664; 340/657; 250/284; 250/286; 250/288

(58) Field of Classification Search .................. 340/664, 340/660, 657, 527; 250/284, 286, 288, 370.05
See application file for complete search history.

(56) References Cited

U.S. PATENT DOCUMENTS

| | | | | |
|---|---|---|---|---|
| 2,656,498 A | * | 10/1953 | Goodwin | 318/665 |
| 3,733,908 A | * | 5/1973 | Linenberg | 73/863.12 |
| 4,367,948 A | * | 1/1983 | Suzuki | 399/48 |
| 4,589,025 A | * | 5/1986 | Monahan et al. | 348/243 |
| 5,315,232 A | * | 5/1994 | Stewart | 324/72 |
| 7,009,182 B2 | * | 3/2006 | Kannan et al. | 250/370.07 |
| 7,238,936 B2 | * | 7/2007 | Okamura et al. | 250/284 |
| 7,256,572 B2 | * | 8/2007 | Swenson et al. | 324/72 |

* cited by examiner

*Primary Examiner* — Hung T. Nguyen
(74) *Attorney, Agent, or Firm* — J. Bennett Mullinax, LLC

(57) ABSTRACT

An electrometer for use in measuring current is provided. The electrometer includes an enclosure capable of containing various components of the electrometer. A pre-amplifier is present and is one of the components of the electrometer. The pre-amplifier is contained by the enclosure. The pre-amplifier has a pre-amplifier enclosure that contains the pre-amplifier and provides radio frequency shielding and magnetic shielding to the pre-amplifier.

19 Claims, 7 Drawing Sheets

| KrorHite | Series Resistor | Input Current | Display Amps | Error % Reading |
|---|---|---|---|---|
| 0.2370 | 4.7350E+13 | 5.005E−15 | 5.01E−15 | 0.09 |
| 0.4740 | 4.7350E+13 | 1.001E−14 | 1.03E−14 | 2.89 |
| 2.3680 | 4.7350E+13 | 5.001E−14 | 4.92E−14 | −1.62 |
| 4.7350 | 4.7350E+13 | 1.000E−13 | 9.94E−14 | −0.60 |
| 47.3500 | 4.7350E+13 | 1.000E−12 | 1.00E−12 | 0.00 |
| 0.0100 | 1.0000E+09 | 1.000E−11 | 1.00E−11 | 0.00 |
| 0.1000 | 1.0000E+09 | 1.000E−10 | 9.99E−11 | −0.10 |
| 1.0000 | 1.0000E+09 | 1.000E−09 | 1.01E−09 | 1.00 |
| 3.0000 | 1.0000E+09 | 3.000E−09 | 3.02E−09 | 0.67 |
| 10.0000 | 1.0000E+09 | 1.000E−08 | 1.01E−08 | 1.00 |
| 100.0000 | 1.0000E+09 | 1.000E−07 | 1.00E−07 | 0.00 |
| 1.0000 | 1.0000E+06 | 1.000E−06 | 1.00E−06 | 0.00 |

FIG.5

INDUSTRIAL UNIVERSAL ELECTROMETER

CROSS REFERENCE TO RELATED APPLICATION

This application claims the benefit of U.S. Application Ser. No. 60/851,150 filed on Oct. 12, 2006 and entitled, "Industrial Universal Electrometer." U.S. application Ser. No. 60/851,150, including all incorporated appendices, is incorporated by reference herein in its entirety for all purposes.

STATEMENT AS TO RIGHTS TO INVENTIONS MADE UNDER FEDERALLY SPONSORED RESEARCH AND DEVELOPMENT

This invention was made with Government support under Contract No. DE-AC0996-SR18500 awarded by the United States Department of Energy. The Government has certain rights in the invention.

FIELD OF THE INVENTION

This invention is directed towards an electrometer that capable of measuring current in a low amp range. More particularly, the present application involves an electrometer capable of operating in an industrial environment that may be programmable, shielded from radio frequency and magnetic fields, temperature compensated, and that may include fail safe features.

BACKGROUND

Tritium is a radioactive isotope of hydrogen that is sometimes used in the production of nuclear weapons. An ionization chamber, which can be used for the detection or measurement of ionizing radiation, may be employed in order to conduct a tritium measurement. Tritium flowing through an ionization chamber emits beta particles that generate a current proportional to the tritium radioactivity. This current can be measured with the use of an electrometer to thus ascertain tritium activity. This current is generally in the $1 \times 10^{-15}$ (femto) amp to $1 \times 10^{-6}$ (micro) amp range.

Certain challenges exist in obtaining accurate measurements of these low currents. For example, the distance between the ionization chamber and the electrometer can be over 100 or 150 feet, and voltages utilized in the 500 to 1000 volt range require that the ionization chamber be grounded to earth ground. This grounding along with long cable lengths and low currents require a special pre-amplifier circuit be employed in the electrometer. Electrometers on the market today suffer from problems such as ground loops, high background currents, erroneous date spikes when changing ranges, alternating current common mode rejection, and susceptibility to electromagnetic interference that includes radio frequency and magnetic fields. Certain electrometers are not capable of being used with different ionization chamber designs that are required by gas pressure, gas type, and range.

Facilities that handle substances such at tritium require routine maintenance checks to ensure all associated equipment is properly functioning. For example, at some Department of Energy facilities monthly calibration and alarm checks must be performed in order to ensure operational readiness. Electrometers in use today do not have a fail safe self monitoring capability and thus require labor intensive monitoring.

Variations in temperature can introduce errors into the final reading when measuring low currents. Electronic components such as amplifiers, transistors, and resistors require time in order to thermally stabilize before an electrometer can accurately measure currents in the $1 \times 10^{-14}$ to $1 \times 10^{-15}$ amp range. Existing electrometers do not provide an indication to the user as to when the electrometer has thermally stabilized and is thus capable of accurately measuring low levels of current. Further, electrometers are only capable of measuring into the low $1 \times 10^{-14}$ amp range when used to measure current in an industrial environment such as during the measurement of tritium in an ionization chamber.

Accordingly, there remains room for variation and improvement within the art.

SUMMARY

Various features and advantages of the invention will be set forth in part in the following description, or may be obvious from the description, or may be learned from practice of the invention.

One aspect of one exemplary embodiment provides for an electrometer for use in measuring current. The electrometer includes an enclosure capable of containing various components of the electrometer. A pre-amplifier is present and is one of the components of the electrometer. The pre-amplifier is contained by the enclosure. The pre-amplifier has a pre-amplifier enclosure that contains the pre-amplifier and provides radio frequency shielding and magnetic shielding to the pre-amplifier.

Another aspect of an additional exemplary embodiment is found in an electrometer as immediately discussed in which the pre-amplifier enclosure has a radio frequency shielding layer and a magnetic shielding layer. The radio frequency shielding layer is made of polytetrafluoroethylene.

An additional aspect of a further exemplary embodiment resides in an electrometer as immediately mentioned in which the magnetic shielding layer lines the inside of the radio frequency shielding layer. The magnetic shielding layer is high magnetic permeability μ metal shielding.

A further aspect of another exemplary embodiment is provided in an electrometer as mentioned above in which the pre-amplifier is completely floating with respect to earth ground.

Also provided in accordance with one aspect of one exemplary embodiment is an electrometer for use in measuring current that has an enclosure capable of containing various components of the electrometer. A pre-amplifier is present and is one of the components of the electrometer and is contained by the enclosure. Alarm circuitry is also present and is another component of the electrometer. The alarm circuitry is capable of informing a user of the electrometer that a particular level of current has been detected. The alarm circuitry is capable of informing the user of the electrometer of the occurrence of an internal malfunction.

An additional aspect is provided in an electrometer as immediately mentioned in which the alarm circuitry includes at least one fail safe relay.

A further aspect of a different exemplary embodiment is found in an electrometer as discussed above in which the alarm circuitry includes a watch dog timer circuit that receives a series of service pulses. The watch dog timer circuit is configured to cause the alarm circuitry to inform the user of the occurrence of an internal malfunction when the watch dog timer fails to receive the service pulse.

One aspect of another exemplary embodiment resides in an electrometer for use in measuring current that has both a pre-amplifier and a central processing unit. The central processing unit is configured to measure the temperature of the pre-amplifier. The central processing unit is capable of producing a signal to result in a change in the output of the pre-amplifier based upon the measured temperature of the pre-amplifier. The change in output of the pre-amplifier results in a more accurate measurement of the current by the electrometer.

Another aspect of yet an additional exemplary embodiment includes an electrometer as immediately mentioned that also has a display in communication with the central processing unit. The display is configured for informing the user during start up of the electrometer that the electrometer is in a warm-up period.

An additional aspect of a further exemplary embodiment resides in an electrometer as discussed previously in which the pre-amplifier is capable of being heated in order to result in a more accurate measurement of the current by the electrometer.

These and other features, aspects and advantages of the present invention will become better understood with reference to the following description and appended claims. The accompanying drawings, which are incorporated in and constitute part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended Figs. in which:

FIG. 5 is a table showing calibration data vs. commercial primary standards.

Figure 1:
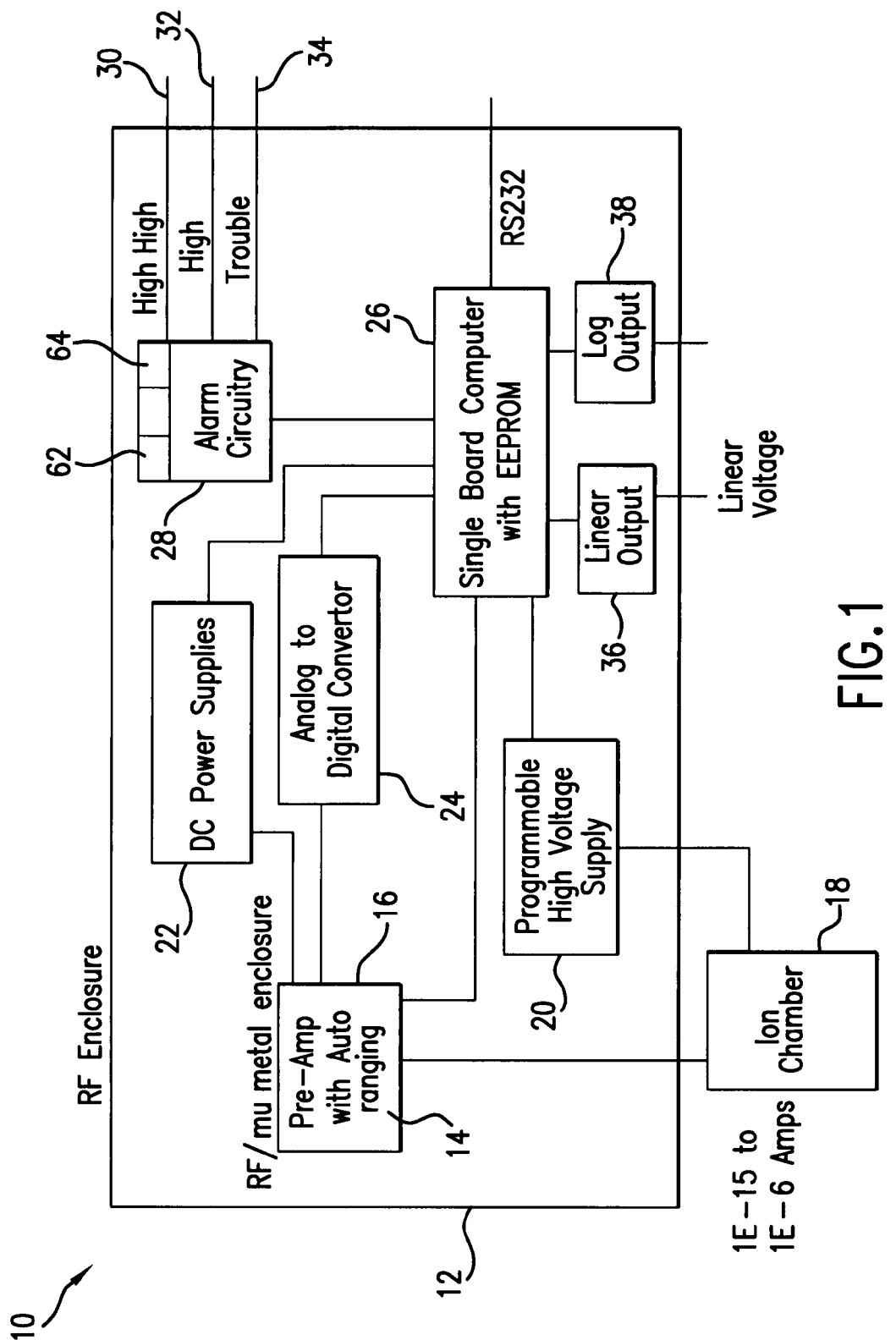
FIG. 1 is a schematic view of various components of an electrometer in accordance with one exemplary embodiment.

Repeat use of reference characters in the present specification and drawings is intended to represent the same or analogous features or elements of the invention.

DETAILED DESCRIPTION OF REPRESENTATIVE EMBODIMENTS

Reference will now be made in detail to embodiments of the invention, one or more examples of which are illustrated in the drawings. Each example is provided by way of explanation of the invention, and not meant as a limitation of the invention. For example, features illustrated or described as part of one embodiment can be used with another embodiment to yield still a third embodiment. It is intended that the present invention include these and other modifications and variations.

It is to be understood that the ranges mentioned herein include all ranges located within the prescribed range. As such, all ranges mentioned herein include all sub-ranges included in the mentioned ranges. For instance, a range from 100-200 also includes ranges from 110-150, 170-190, and 153-162. Further, all limits mentioned herein include all other limits included in the mentioned limits. For instance, a limit of up to 7 also includes a limit of up to 5, up to 3, and up to 4.5.

The present invention provides for an electrometer 10 that is capable of being used to measure low level current. The electrometer 10 can be provided with one or more robust features to find utility in an industrial environment. The electrometer 10 can also be constructed so that one or more of the above mentioned items associated with current electrometers are alleviated. The electrometer 10 may incorporate a pre-amplifier 14 that is shielded from radio frequency and magnetic fields, fail safe relays 62 for alarm indication, a watch dog timer circuit 64 to signal an alarm for central processing unit 26 failures, and a correction scheme for temperature variations in order to improve accuracy. Various exemplary embodiments exist in which one or more of these features, in addition to or alternatively to further to be described features, are incorporated into the electrometer 10.

Figure 2:
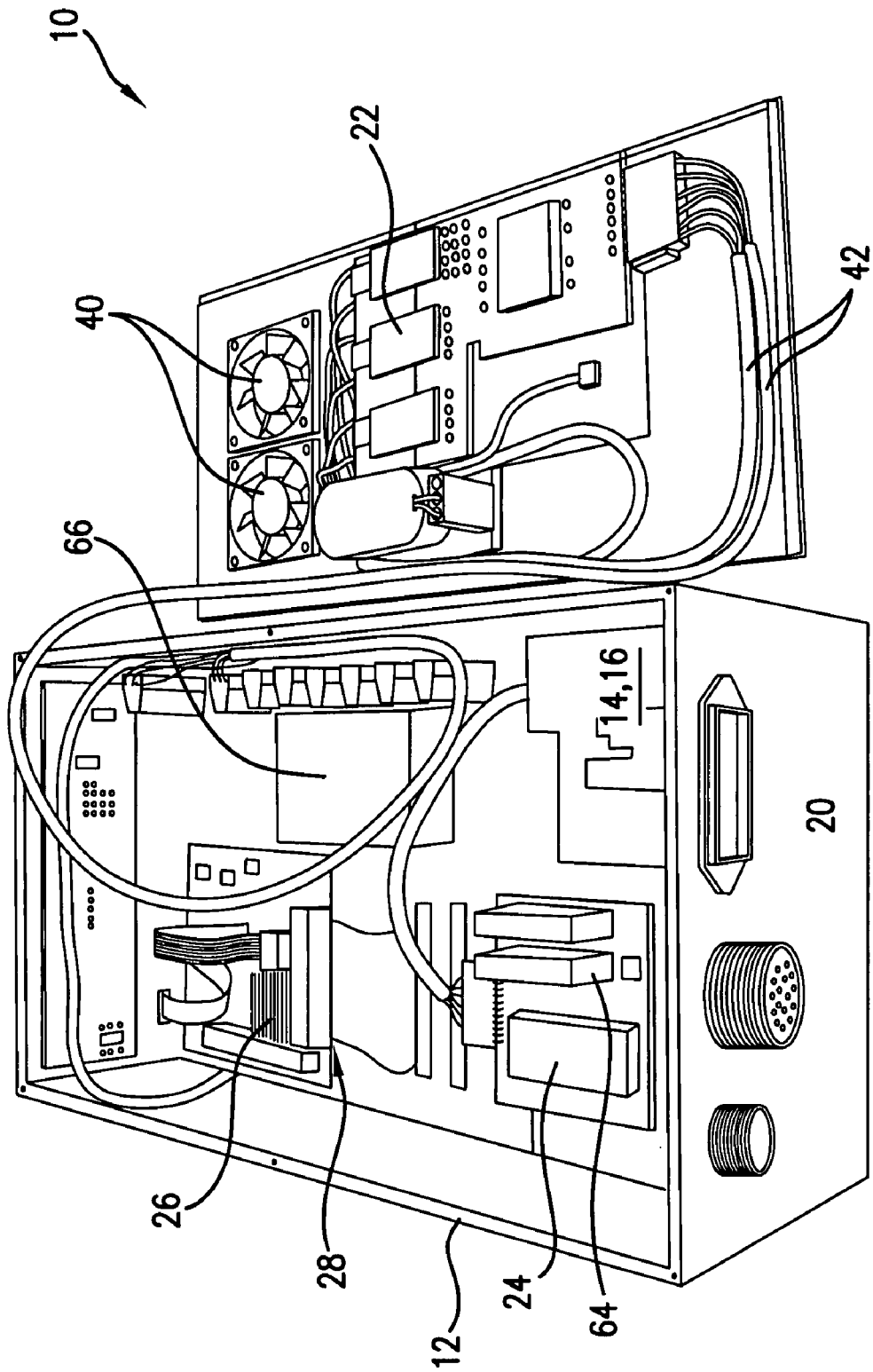
FIG. 2 is a perspective view of an electrometer with the top removed in accordance with one exemplary embodiment.
Figure 3:
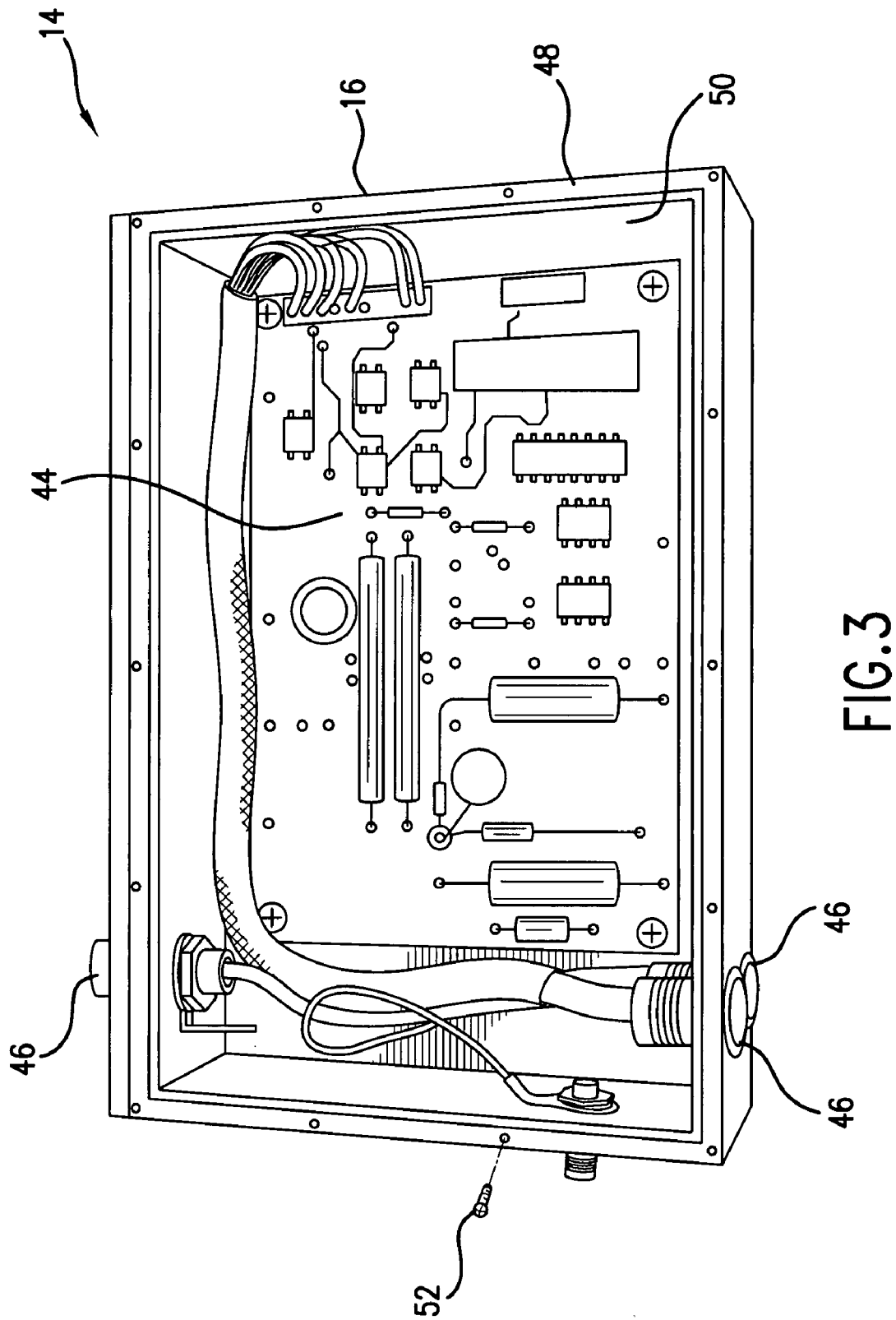
FIG. 3 is a top view of a pre-amplifier of the electrometer of FIG. 2 with the top removed.

A schematic circuit diagram of one exemplary embodiment of an electrometer 10 is shown with reference to FIG. 1. The electrometer 10 includes a pre-amplifier 14 and a high voltage supply 20 that are both in communication with an ionization chamber 18. The electrometer 10 can be used to measure current in the ionization chamber 18 in order to, for example, conduct a tritium measurement. The electrometer 10 is shown with its top cover removed in the perspective view of FIG. 2. The pre-amplifier 14, that includes its enclosure 16, is located in the bottom right hand portion of the enclosure 12 of the electrometer 10. FIG. 3 is a top view of the pre-amplifier 14 shown removed from the enclosure 12 and with its cover removed.

The pre-amplifier 14 can be constructed so that it incorporates radio frequency and magnetic shielding and has a zero correction technique. It is sometimes the case that any AC noise at the input of the pre-amplifier 14 is amplified by a factor of $1 \times 10^{12}$. The enclosure 16 of the pre-amplifier 14 is constructed in order to provide both RF and magnetic shielding. The radio frequency shielding 48 can be lined with the magnetic shielding 50 in order to protect the various electronic components of the pre-amplifier 14. The radio frequency shielding 48 can be made of any substance that has high dielectric properties to provide for effective insulation. In accordance with one exemplary embodiment, the radio frequency shielding 48 is made of aluminum and is insulated with a sheet of TEFLON® (provided by E.I. du Pont de Nemours and Company, 1007 Market St., Wilmington, Del., 19898) to provide high resistance insulation. In accordance with another exemplary embodiment, one or more layers of polytetrafluoroethylene can be located between the enclosure 16 and the enclosure 12. This layer or layers may be part of the enclosure 16 or can be a separate component. In accordance with another exemplary embodiment, the layer or layers are made of TEFLON®. The magnetic shielding 50 may be high magnetic permeability µ metal shielding in accordance with one exemplary embodiment and lines the inside of the radio frequency shielding 48. However, it is to be understood that other exemplary embodiments are possible in which the radio frequency shielding 48 is located inside of the magnetic shielding 50. The faces of the enclosure 16 of pre-amplifier 14 can be attached through the use of insulated screws. In accordance with certain exemplary embodiments insulated TEFLON® screws may be used to attach an enclosure 16 having an outer TEFLON® layer to another portion of the electrometer 10 so that the enclosure 16 is carried within the enclosure 12.

The circuit board included in the pre-amplifier 14 can be a six layer printed circuit board 44 that features multiple ground planes and has all critical traces guarded. The various connections to the pre-amplifier 14 can be soldered to insulated stand offs 46. One of these connections may include a feedback circuit as will be momentarily discussed. The use of insulated stand offs 46 function to help reduce limitations of input impedance of the six layer printed circuit board 44. The insulated stand offs 46 can be constructed from any insulated material. For instance, the insulated stand offs 46 can be made of TEFLON® in accordance with one exemplary embodiment. The enclosure 16 may thus be arranged so that the interior components, such as the six layer printed circuit board 44, are isolated from RF and magnetic fields by being completely surrounded with insulation material both in the walls of the enclosure and through use of the insulated stand offs 46 at the input/output points. In accordance with one exemplary embodiment, isolation of the pre-amplifier 14 through the use of the radio frequency shielding 48 and the magnetic shielding 50 caused the feedback capacitor of the pre-amplifier 14 to be reduced to 1 pF which allowed for a one second response time in the $1 \times 10^{-15}$ amp range.

The pre-amplifier 14 may thus be completely floating with respect to earth ground. This arrangement helps eliminate ground loops and provides exceptional common mode rejection. The enclosure 16 of the pre-amplifier 14 can be isolated from the remaining components 12 of the electrometer 10 in the enclosure 12. In this regard, the enclosure 16 can be isolated through the use of one or more TEFLON® sheets and screws so that the enclosure 16 can be mounted onto the interior of enclosure 12 yet isolated therefrom. In accordance with one exemplary embodiment the enclosure 16 is made of an outer layer of polytetrafluoroethylene that may be TEFLON®, an intermediate layer 48 of radio frequency shielding, and an inner most layer of µ metal magnetic shielding 50.

As previously discussed, temperature fluctuations in various electrical components of the electrometer 10 can cause errors in the measured current value. Electrical components such as amplifiers, transistors and resistors need time in order to stabilize, after start-up, before the electrometer 10 is capable of accurately measuring currents in the $1 \times 10^{-15}$ and $1 \times 10^{-14}$ amp range. The electrometer 10 may be provided with a zero correction circuit in order to prevent or reduce errors associated with temperature fluctuations. In this regard, a central processing unit 26 can continuously monitor the temperature of the pre-amplifier 14 and using a temperature correction algorithm can cause a zero volt to ten volt analog signal to be produced from a twelve bit digital to analog converter 24. The signal from the digital to analog converter 24 is fed into a divide by −100 amplifier circuit which results in a 0 to −100 mV output. This voltage may be added by a summing amplifier to the output of the pre-amplifier 14 thus effectively nulling out any zero offset associated with temperature change. The summing amplifier may be included with the pre-amplifier 14 in the enclosure 16. The system may correct for zero drift every 30 seconds in accordance with one exemplary embodiment. The use of an auto zero correction circuit may be advantageous in that trim pots with large temperature coefficients need not be employed in the electrometer 10. The central processing unit 26, in addition to other various electronic components in the electrometer 10, can include printed circuit boards in order to reduce noise pickup. Further, shielded cables 42 can be used through the electrometer 10 to reduce noise pickup. Although described as being a single board computer with EEPROM in FIG. 1, the central processing unit 26 can be variously configured in accordance with other exemplary embodiments and it is to be understood that the components as labeled in the Figs. are only one possible configuration.

Figure 4:
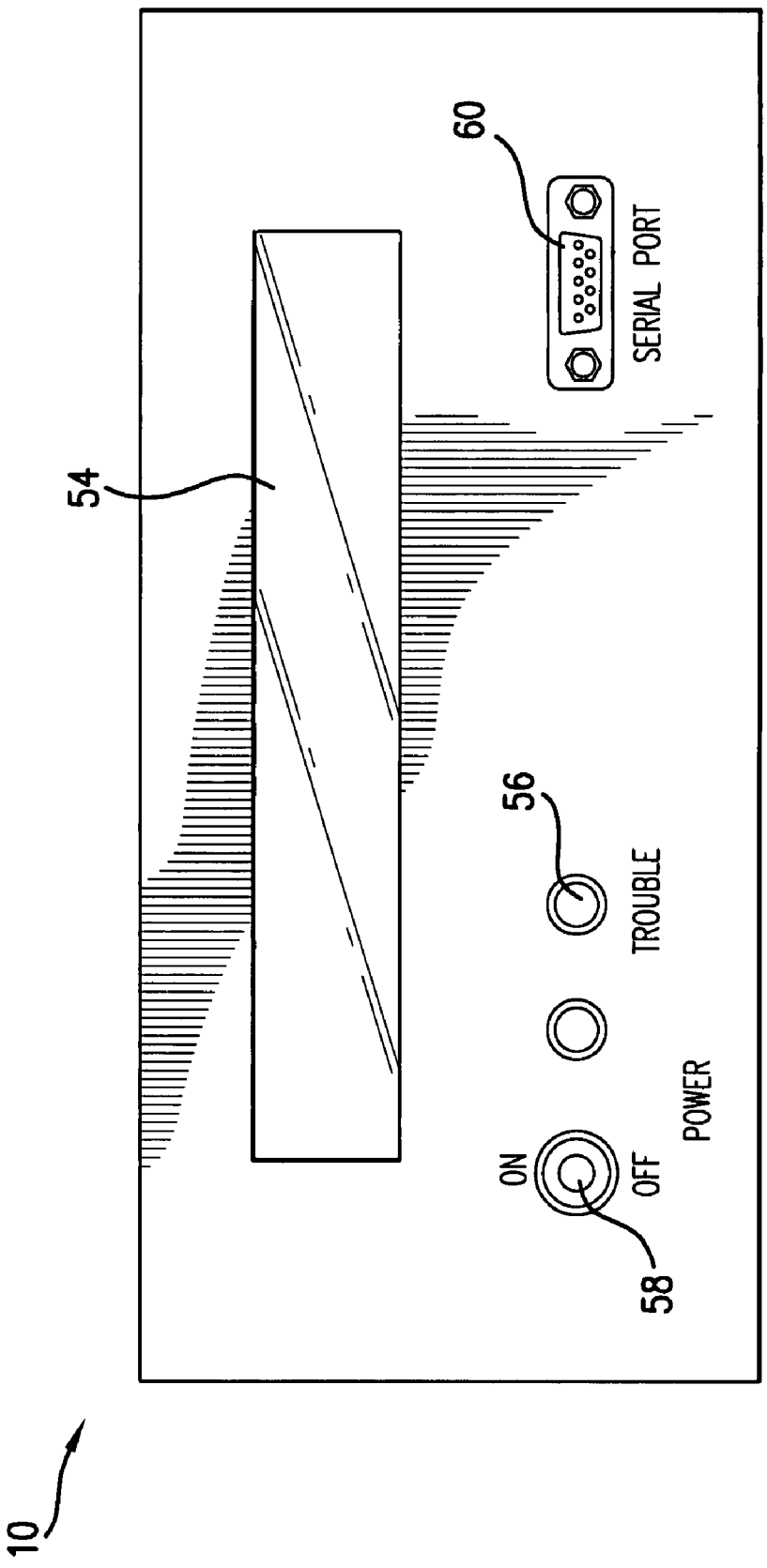
FIG. 4 is a front view of the electrometer of FIG. 2.

The electrometer 10 can be arranged so that it warns the user of the potential for erroneous current readings during the initial start-up phase of the electrometer 10 when the various pre-amplifier 14 circuitry begins to heat. The front of the electrometer 10 can include a display 54 as shown in FIG. 4. A warning may be visually displayed on display 54 after start-up to warn the user of the potential for erroneous readings due to initial start-up temperature fluctuations. In accordance with one exemplary embodiment, this warning may persist for a predetermined amount of time, for example up to one minute. Although described as providing a visual warning on display 54, an audio warning may be issued upon start-up in accordance with other embodiments. The warning to the user may persist for a predetermined amount of time, or alternatively may cease upon noting that the temperature of the pre-amplifier 14 has reached a desired level upon monitoring.

In accordance with another exemplary embodiment, the electrometer 10 can be arranged so that a separate offset algorithm is employed by the central processing unit 26 in order to correct for errors in temperature fluctuations by generating an appropriate voltage to be added to the pre-amplifier 14. This start-up algorithm may be established through actual response of the electrometer 10 through testing. After the components of the pre-amplifier 14 have heated to normal operating temperatures, the start-up algorithm may no longer be used and the central processing unit 26 can shift back to the one previously described.

The central processing unit 26 is programmable in order to accommodate various types of gasses in the ionization chamber 18, calibration coefficients, and alarm set points. Output from the central processing unit 26 can be in the form of linear output 36 or analog output 38. In accordance with certain exemplary embodiments, the linear and log outputs 36 and 38 can have attachments similar to the insulated stand offs 46 of the pre-amplifier 14 as previously explained. The linear and log outputs 36 and 38 can be connected to distributed control systems, strip chart recorders and data acquisition systems. The analog output may be fed back into an analog input to ensure the correct signal is being transmitted.

The electrometer 10 may also be provided with alarm circuitry 28 that can include one or more fail safe relays 62. A fail safe relay 62 may be included in order to provide an alert should portions of the wiring break or should electronic components of the electrometer 10 fail. The fail safe relays 62 can configured for being used to actuate alerts to the user such as a "high high" alert 30, a "high" alert 32, and a "trouble" alert 34. The "high" alert 32 may be used should the electrometer 10 pick up a high level of tritium from the ionization chamber 18. The "high high" alert 30 may be actuated by the fail safe relay 62 should an even higher level of tritium be detected. The "trouble" alert 34 may be actuated in order to inform the user that the electrometer 10 is experiencing some sort of internal malfunction. A variety of arrangements may be employed. In accordance with one embodiment the fail safe relay 62 actuating the "trouble" alert 34 is connected in series with the fail safe relay 62 actuating the "high" alert 32 and opens on loss of electrical power or failure.

The alarm circuitry 28 can further be provided with a watch dog timer circuit 64. The central processing unit 26 or other component of the electrometer 10 can send a service pulse to the watch dog timer circuit 64 after a predetermined amount of time such as up to 30 seconds. Should the watch dog timer circuit 64 fail to receive a service pulse, a fail safe relay 62 or the watch dog timer circuit 64 itself may cause the "trouble" alert 34 to actuate. Actuation of the "trouble" alert 34 may inform the user that the central processing unit 26 or other component responsible for signaling the watch dog timer circuit 64 has failed and is thus in need of repair. The electrometer 10 can also be arranged so that actuation of the watch dog timer circuit 64 or one or more of the fail safe relays 62 causes the electrometer 10 to enter a safe mode until the faulting component or signal is cleared. Here, the electrometer 10 may send a command to stop activity in the ionization chamber 18 or other source producing the measured current, may cease emission of any high voltage electrical output, or may shut down until the error or failure state is corrected. The fail safe relays 62 may be integrated with the watch dog timer circuit 64 so that these components are contained within the same module or modules.

A programmable high voltage supply 20 can be included in the electrometer 10. In accordance with one exemplary embodiment, the high voltage supply 20 may be fully programmable and can supply from 0 to 1200 volts with low ripple covering. The central processing unit 26 can be arranged so as to monitor the output of the high voltage supply 20 for accuracy. Should the central processing unit 26 monitor an emitted voltage outside of an identified range, the watch dog timer circuit 64 or one of the fail safe relays 62 may be activated in order to alert the user of a potential problem.

The electrometer 10 can be provided with an isolated power supply 66 that powers the pre-amplifier 14 in accordance with one exemplary embodiment. A linear transformer may be arranged between the isolated power supply 66 and the pre-amplifier 14 in order to control voltage into the pre-amplifier 14. Isolation of the power supply of the pre-amplifier 14 may be useful in order to ensure complete isolation of the pre-amplifier 14 and to reduce DC ripple. As an alternative arrangement to using an isolated power supply 66, a DC power supply 22 can be used to power the pre-amplifier 14. In a further embodiment, the isolated power supply can be used to drive the pre-amplifier 14 circuit while the DC power supply 22 is used to power other components of the electrometer 10 such as the central processing unit 26 and the cooling fans 40. This type of an arrangement may be beneficial in that the pre-amplifier 14 will be isolated and other components of the electrometer 10 can be driven by the DC power supply 22 which reduces cost and saves space within the enclosure 12.

Referring now to FIG. 4, the front of the electrometer 10 can include a power switch 58 that is used to turn the device on or off. A visual display 54 is provided in order to display the amount of current sensed or the amount of measured tritium in accordance with certain embodiments. Also, as discussed, the display can be used to inform the user of the warm-up period of the electrometer 10 upon start-up. A serial port 60 may be provided in order to program the central processing unit 26 or to retrieve data related to the electrometer's 10 measurements. As shown, a "trouble" indicator 56 is present that may be a lamp or a light emitting diode that illuminates upon a malfunction or other fault of the electrometer 10. Although not shown, it is to be understood that additional lamps or light emitting diodes can be present on the front of the electrometer 10 in order to convey a "high" alert 32 or a "high high" alert 30. Still further, these alerts may instead be visually displayed on the display 54 instead of or in addition to being indicated through the use of illuminated lamps or light emitting diodes.

FIG. 5 is a table showing calibration data of the electrometer 10 in accordance with one exemplary embodiment versus current laboratory standards. The uncertainty of the laboratory standards at the low end, that is from $1\times10^{-15}$ to $1\times10^{-13}$, is approximately 3% or 2 sigma.

Figure 6:
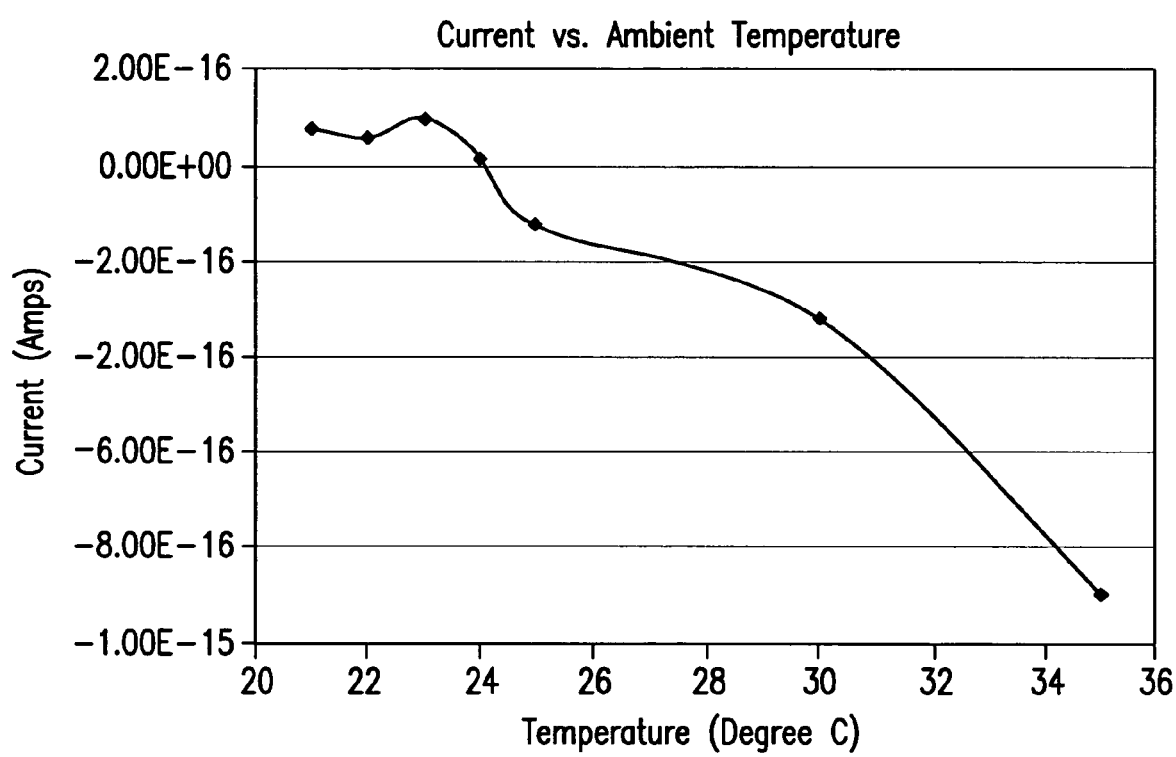
FIG. 6 is a graph showing current vs. ambient temperature.

FIG. 6 is a graph of current versus temperature for the electrometer 10 in accordance with one exemplary embodiment. A temperature sensor was placed directly on an op-amp in the pre-amplifier 14 in order to measure the temperature of the pre-amplifier 14. The ambient temperature in the laboratory varied from approximately 21° C. to 35° C. As shown, the corresponding background drift was from approximately $2\times10^{-16}$ amps to $-9\times10^{-16}$ amps. Arrangement of the electrometer 10 as previously discussed thus results in improved temperature compensation of the pre-amplifier 14 offset voltage.

An additional exemplary embodiment of the electrometer 10 may include a pre-amplifier 14 in which the enclosure 16 is capable of being heated. The temperature of the pre-amplifier 14 can be set at a temperature above the ambient dew point and can be stabilized to a range of ±1° C. The auto zero correction circuit may also be employed as previously discussed with this heated pre-amplifier 14 so that a better zero drift may be achieved such as less than $\pm1\times10^{-15}$ amps. Such an arrangement has the added advantage of controlling humidity in the pre-amplifier 14 to both protect the associated circuitry and increase accuracy. However, it is to be understood that other embodiments exist in which the pre-amplifier 14 is not heated.

The electrometer 10 can thus be arranged with components as previously described so that the effects of ambient temperature variations on the resulting current reading are reduced.

One challenge associated with measurements of an ionization chamber 18 through the use of an electrometer 10 involve a poor or no connection between the ionization chamber 18 high voltage connection or a poor or no signal connection between the ionization chamber 18 and the electrometer 10. A "clean" ionization chamber 18 usually exhibits a background current in the low $1\times10^{-14}$ amp range. Current in this range is usually indistinguishable from other sources of background current. For example, a long amount of cable, such as 150 feet, that is not connected to an ionization chamber 18 may impart a similar degree of background current into the system. The electrometer 10 may be constructed so that it is capable of detecting a poor or no connection to the ionization chamber 18 and a poor or no connection to the high voltage supply 20.

In one arrangement, the electrometer 10 can be programmed so that a small change in the high voltage provided by the high voltage supply 20 can be introduced and monitored at high speed. This action causes a unique signature to occur based upon the capacitance of the loop. The introduction of a small negative step function of the high voltage can be controlled by the central processing unit 26 and may happen at any desired time while taking measurements with the electrometer 10. If the response after generating the small change in the high voltage from the high voltage supply 20 does not match expected values, the "trouble" alert 34 can be actuated to indicate a possible loop problem. A loop check of this type may be beneficial in environments in which safety is of a high priority such as those dealing with radioactive material. The loop check routine combined with other self checking and safety features may eliminate the need for routine, monthly source checks of an electrometer.

Figure 7:
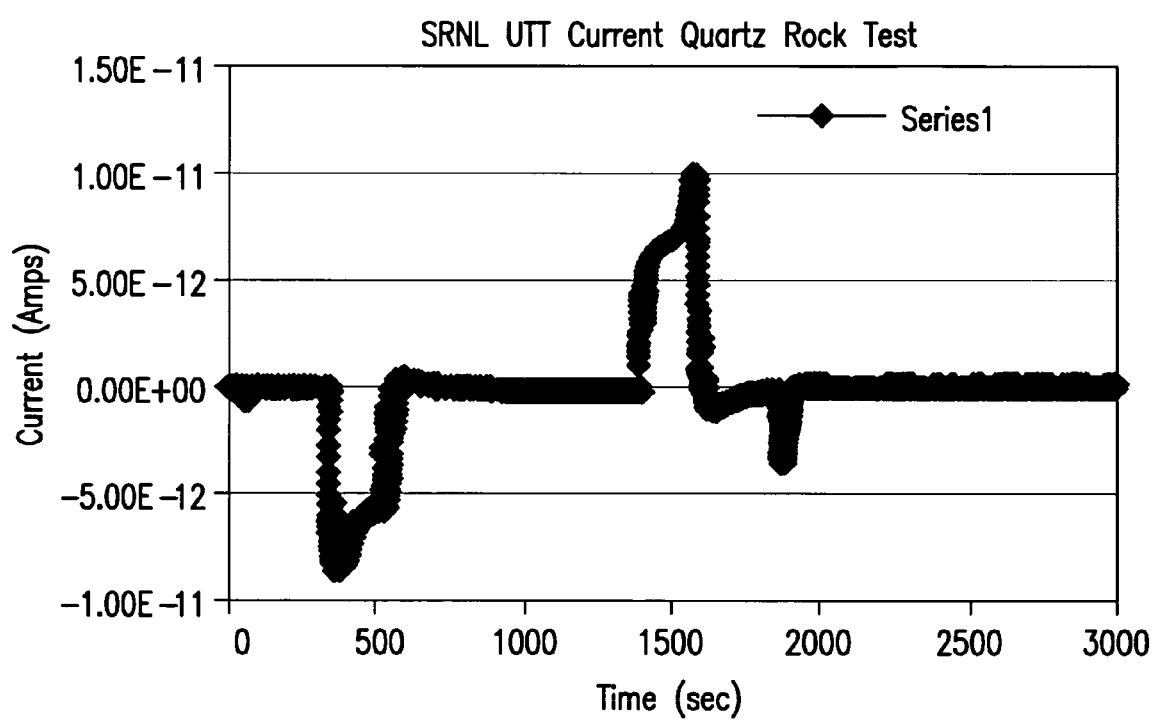
FIG. 7 is a graph setting forth the ability of the electrometer to detect changes in quartz rock samples when placed under stress.

FIG. 7 illustrates quartz rock stress data received from an electrometer 10 in accordance with one exemplary embodiment. Quartz rock samples were subjected to periodic stress which resulted in the displayed current spikes. Incorporation of one or more of the above identified components or arrangements may permit the electrometer 10 to distinguish over background noise in order to detect low current encountered in an ionization chamber 18. Aforementioned problems such as instrument drift, temperature fluctuations, electromagnetic interference, and electrical noise may all be minimized so that measurements of current fluctuations, for example those shown in FIG. 8, may be obtained. However, it is to be understood that not all of the aforementioned beneficial features need be incorporated in every version of the electrometer 10 and any combination is thus possible. In accordance with various exemplary embodiments the electrometer 10 may be fully programmable, have a pre-amplifier 14 shielded from RF and magnetic fields, have fail-safe features, and/or be temperature compensated and resistant to humidity changes.

Previously described exemplary embodiments have been arranged so that a detection range between $1\times10^{-15}$ amps to $1\times10^{-6}$ amps was obtained. However, it is to be understood that the electrometer 10 can be modified so that various current ranges are possible. For example, adjustment of the values of the feedback resistors in the pre-amplifier 14, along with software adjustments, may be made so that the range covered may be from $1\times10^{-12}$ amps to $1\times10^{-3}$ amps. Further, it is to be understood that other measured ranges are possible in accordance with other embodiments and that the disclosed ranges are only exemplary. Adjustments of the current ranges can be obtained by using a multi order fit versus existing electrometers that depend on resistor values introducing nonlinearity. The electrometer 10 can be utilized in an industrial environment and may be universal in that it can be used with a variety of different types of ionization chambers 18. The electrometer 10 is adjustable in order to find utility for a particular application. For example, parameters involving high voltage supplies, gas type, current ranges, alarm setpoints, calibration coefficients, etc. can be adjusted to allow the electrometer 10 to perform measurements.

Additionally, although described as being used in conjunction with an ionization chamber 18, the electrometer 10 can be used for the measurement of current in a variety of applications and it is to be understood that measurement related to an ionization chamber 18 is but one example. For example, the electrometer 10 may be used for current measurements of Faraday cup amplifiers that are used in high resolution mass spectrometers. The electrometer 10 can be capable of obtaining current measurements from a variety of enclosures such as glove boxes, shielded radiation containment rooms, or other aggressive environments.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

That which is claimed:

1. An electrometer for use in measuring current, comprising:
    an enclosure capable of containing various components of the electrometer; and
    a pre-amplifier that is one of the components of the electrometer and is contained by the enclosure, wherein the pre-amplifier has a pre-amplifier enclosure that contains the pre-amplifier and provides radio frequency shielding and magnetic shielding to the pre-amplifier;
    wherein the pre-amplifier enclosure has a radio frequency shielding layer that shields the pre-amplifier enclosure from radio frequency and wherein the pre-amplifier enclosure has a magnetic shielding layer that is high magnetic permeability micro metal shielding that shields the pre-amplifier from a magnetic field.

2. The electrometer as set forth in claim 1, wherein the magnetic shielding layer lines the inside of the radio frequency shielding layer, and wherein the radio frequency shielding layer is made of aluminum.

3. The electrometer as set forth in claim 1, wherein the pre-amplifier enclosure further has a layer of polytetrafluoroethylene between the pre-amplifier and the enclosure, and wherein polytetrafluroethylene screws are used to attach the pre-amplifier enclosure to the enclosure.

4. The electrometer as set forth in claim 1, wherein the pre-amplifier has a circuit board that is a six layer printed circuit board, and wherein the pre-amplifier has at least one insulated stand off for connection to various connections of the printed circuit board, wherein the at least one insulated stand off is made of polytetrafluoroethylene.

5. The electrometer as set forth in claim 1, wherein the pre-amplifier is completely floating with respect to earth ground.

6. The electrometer as set forth in claim 1, further comprising alarm circuitry that has fail safe relays and a watch dog timer circuit, wherein the alarm circuitry is capable of informing a user of the electrometer that a particular level of current has been detected, and wherein the alarm circuitry is capable of informing the user of the electrometer of the occurrence of an internal malfunction.

7. The electrometer as set forth in claim 6, further comprising:
    a central processing unit configured to measure a temperature of the pre-amplifier, wherein the central processing unit is capable of producing a signal to result in a change in the output of the pre-amplifier based upon the measured temperature of the pre-amplifier, wherein the change in output of the pre-amplifier results in a more accurate measurement of the current by the electrometer;
    an isolated power supply that is contained by the enclosure; and
    a programmable voltage supply that is contained by the enclosure.

8. An electrometer for use in measuring current, comprising:
    an enclosure capable of containing various components of the electrometer;
    a pre-amplifier that is one of the components of the electrometer and is contained by the enclosure, wherein the pre-amplifier has a layered printed circuit board that has multiple ground planes; and
    alarm circuitry that is another component of the electrometer, wherein the alarm circuitry is capable of informing a user of the electrometer that a particular level of current has been detected, and wherein the alarm circuitry is capable of informing the user of the electrometer of the occurrence of an internal malfunction.

9. The electrometer as set forth in claim 8, further comprising a display capable of providing a visual alert to the user in response to a signal from the alarm circuitry indicative of the detection of a particular level of current, and wherein the display is capable of providing a visual alert to the user in response to a signal from the alarm circuitry indicative of the detection of an internal malfunction.

10. The electrometer as set forth in claim 8, wherein the alarm circuitry includes at least one fail safe relay.

11. The electrometer as set forth in claim 8, wherein the alarm circuitry includes a watch dog timer circuit that receives a series of service pulses, wherein the watch dog timer circuit is configured to cause the alarm circuitry to inform the user of the occurrence of an internal malfunction when the watch dog timer fails to receive the service pulse.

12. The electrometer as set forth in claim 11, further comprising a central processing unit, wherein the central processing unit sends the series of service pulses to the watch dog timer circuit one after the other after a predetermined amount of time, wherein when the watch dog timer circuit fails to receive one of the service pulses the watch dog timer circuit is configured to cause the alarm circuitry to inform the user of the failure of the central processing unit.

13. The electrometer as set forth in claim 8, further comprising:
   a central processing unit contained by the enclosure; and
   a high voltage supply contained by the enclosure, wherein the high voltage supply is capable of providing voltage that can be changed in an amount so as to cause a unique signature to occur based on the capacitance of a loop associated with the high voltage supply, wherein if the response after generating the change in voltage from the high voltage supply does not match expected values an alert is informed to the user to indicate a possible loop problem.

14. An electrometer for use in measuring current, comprising:
   a pre-amplifier; and
   a central processing unit that receives a temperature measurement of the pre-amplifier, wherein the central processing unit is capable of producing a signal to result in a change in the output of the pre-amplifier based upon the measured temperature of the pre-amplifier, wherein the change in output of the pre-amplifier results in a more accurate measurement of the current by the electrometer.

15. The electrometer as set forth in claim 14, further comprising a digital to analog converter that produces a zero volt to ten volt signal based upon the temperature monitoring of the pre-amplifier by the central processing unit, wherein the voltage is ultimately added to the to the output of the pre-amplifier in order to null any zero offset associated with temperature variations of the pre-amplifier.

16. The electrometer as set forth in claim 15, wherein the voltage signal from the digital to analog converter is further processed before being added to the output of the pre-amplifier.

17. The electrometer as set forth in claim 14, further comprising a display in communication with the central processing unit, wherein the display is configured for informing the user during start up of the electrometer that the electrometer is in a warm-up period.

18. The electrometer as set forth in claim 14, wherein the central processing unit is capable of producing a signal to result in a change in the output of the pre-amplifier based upon start-up of the electrometer in order to result in a more accurate measurement of the current by the electrometer, wherein after the start-up phase is complete the central processing unit is capable of producing a signal to result in a change in the output of the pre-amplifier based upon the measured temperature of the pre-amplifier.

19. The electrometer as set forth in claim 14, wherein the pre-amplifier is capable of being heated in order to result in a more accurate measurement of the current by the electrometer.

* * * * *